United States Patent [19]

Topmiller

[11] Patent Number: 5,029,278
[45] Date of Patent: Jul. 2, 1991

[54] TRANSDUCER INTERFACE CIRCUIT
[75] Inventor: David A. Topmiller, Ft. Wright, Ky.
[73] Assignee: Cincinnati Milacron Inc., Cincinnati, Ohio
[21] Appl. No.: 459,879
[22] Filed: Jan. 2, 1990
[51] Int. Cl.[5] .................... H03K 17/14; H03K 17/16; H03K 17/06; H03K 5/08
[52] U.S. Cl. .................. 307/565; 307/559; 307/552; 307/561; 340/652; 324/537
[58] Field of Search .............. 307/296.3, 296.4, 296.6, 307/270, 552, 559, 561, 565; 340/595, 652; 324/500, 537

[56] References Cited
U.S. PATENT DOCUMENTS

| | | | |
|---|---|---|---|
| 3,283,259 | 11/1966 | Banks | 307/559 X |
| 3,731,296 | 5/1973 | Spira | 340/652 X |
| 4,155,080 | 5/1979 | Kovacs | 340/595 |
| 4,301,403 | 11/1981 | Hawkes et al. | 324/537 X |
| 4,727,332 | 2/1988 | Bundy | 307/561 X |
| 4,764,759 | 8/1988 | Braun et al. | 340/652 X |
| 4,791,321 | 12/1988 | Tanaka et al. | 307/559 X |
| 4,833,342 | 5/1989 | Kiryu et al. | 307/559 X |
| 4,877,981 | 10/1989 | Gomes | 307/561 X |

OTHER PUBLICATIONS
Analog Devices product brochure-AD594/AD595.

Primary Examiner—Stanley D. Miller
Assistant Examiner—David R. Bertelson
Attorney, Agent, or Firm—John W. Gregg

[57] ABSTRACT

A transducer interface circuit is provided having means for detecting loss of connection of a transducer to the interface circuit. The interface circuit is intended for use with a transducer providing an output between two electrical poles of opposite polarity. Differential inputs of a differential amplifier are connected to the transducer poles. A bias current source is provided proximate the amplifier at least at one input, and the other input is connected to ground. Loss of connection between the transducer and amplifier results in saturation of the amplifier output.

5 Claims, 1 Drawing Sheet

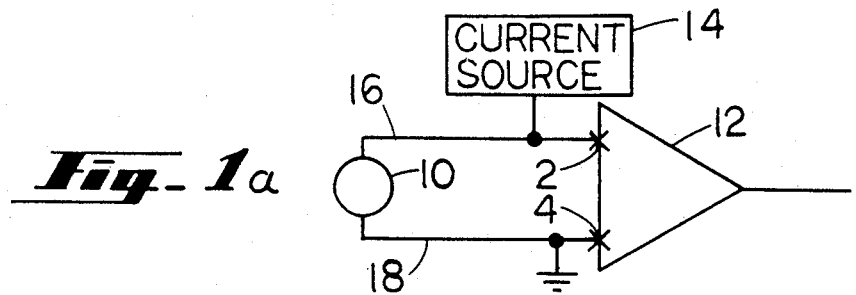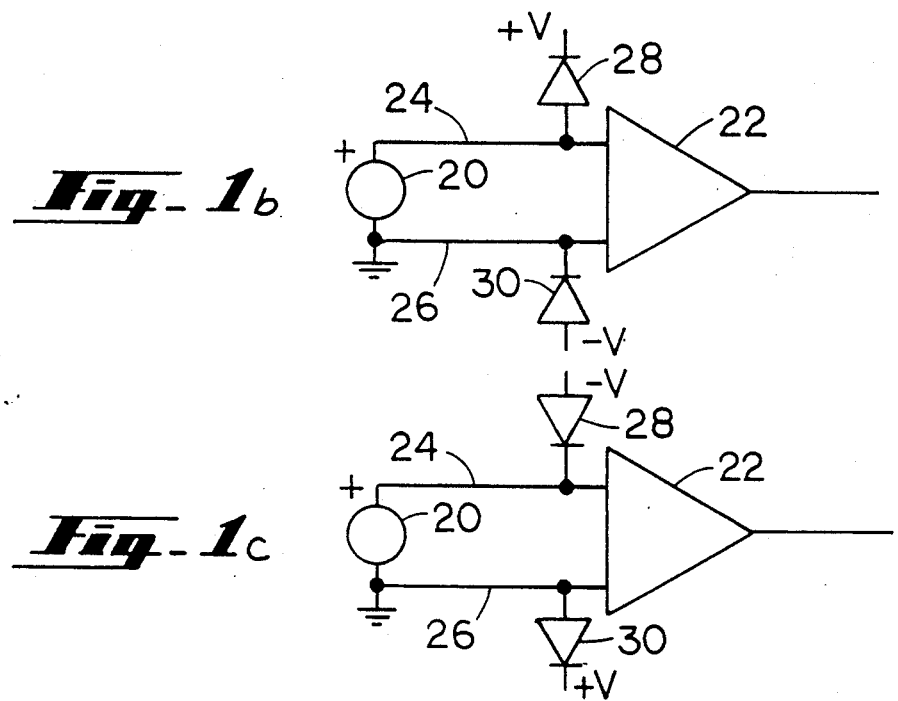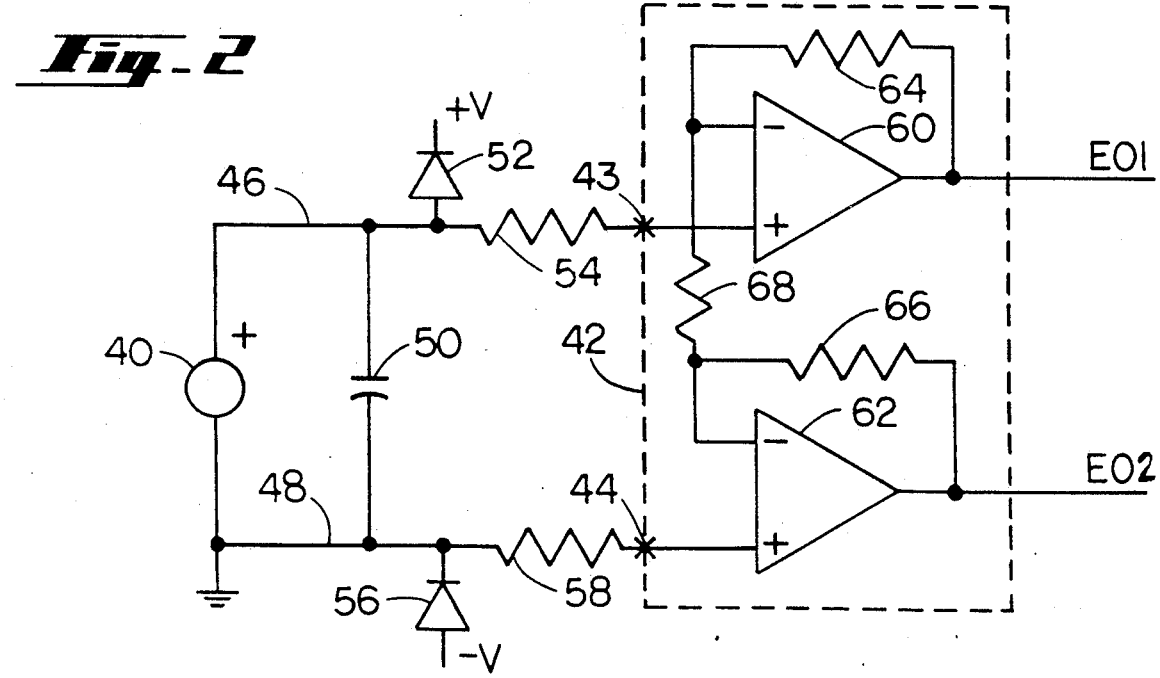

TRANSDUCER INTERFACE CIRCUIT

BACKGROUND OF THE INVENTION

1. Field of the Invention

This invention relates generally to fault detection circuitry and particularly to detection of loss of connection between a transducer and an amplifier used to amplify the transducer output signals.

2. Description of the Prior Art

Transducers, such as thermocouples, typically produce output signals of very low level requiring amplification for use in monitoring and control systems. In such systems, it is not uncommon for the interconnections between the transducer and the amplification circuitry to include substantial wire lengths and multiple connections. Further, it is not uncommon that such connections be made by mating connector components, such as sockets and pins, which are susceptible to loss of continuity when used with low level signals. To insure the integrity of the signal produced by the amplifiers, it is desired to provide detection of loss of connection between the amplifier circuit and the transducer.

U.S. Pat. No. 4,155,080 issued 15 May 1979 to Kovacs discloses circuitry for detecting an open circuit between a thermocouple and a monitoring system. The detector uses an optical coupler having a light emitting diode driven by a power source independent of the thermocouple and a photo transistor connected with series resistance across the thermocouple output. In the arrangement disclosed in this patent, loss of connection between the transducer and the amplifier causes the current conducted by the photo transistor to charge a capacitor connected across the transducer to a level opposite in polarity to the normal condition. Since the photo transistor continuously conducts, the series resistance must be large to minimize the current through the photo transistor which appears as a load to the thermocouple output. The arrangement of this patent suffers the draw back of the relatively high cost of the optical coupler and the additional cost of providing large series resistance to limit the offset current drawn by the optical coupler. In light of the limitations of the prior art, it is desired to provide a simpler and less costly circuit for detection and loss of connection between a transducer and an amplifier.

SUMMARY OF THE INVENTION

It is an object of the present invention to provide an interface circuit for a transducer wherein a current source is provided for saturating an amplifier in the event of loss of connection between the amplifier and the transducer.

It is a further object of the present invention to provide an interface circuit for a transducer wherein bias current means are provided for detecting loss of connection between an amplifier and the transducer without introducing error signals into the output of the transducer.

It is a still further object to provide an interface circuit for a transducer, the circuit including a differential operational amplifier and having bias current supply means connected to the differential inputs thereof to cause saturation of the amplifier in the event of loss of connection between the amplifier and the transducer.

Further objects and advantages of the present invention shall become apparent in the description contained herein.

The present invention provides a transducer interface circuit including a differential operational amplifier having its differential inputs normally connected to opposite electrical poles of a transducer. At least one bias current source is provided to effect saturation of the amplifier in the event of loss of connection between the transducer and amplifier. The bias current source is advantageously implemented as a diode connected between one of the amplifiers differential inputs and a voltage source such that the diode is reverse biased. When the transducer is connected with one electrical pole grounded, as is preferred, bias current sources are provide for each amplifier differential input. The reverse current through the diodes is normally conducted to ground and has no effect on the signals sensed by the differential amplifier. In the event connection is lost between the transducer and the amplifier, the diode reverse current saturates the amplifier.

BRIEF DESCRIPTION OF THE DRAWINGS

FIG. 1 (*a*) is a current diagram showing a transducer interface having a single bias current source.

FIGS. 1(*b*) and 1(*c*) are diagrams of transducer interface circuits for use with grounded transducers and showing alternative connections for positive and negative amplifier saturation.

FIG. 2 shows a detailed circuit diagram in accordance with the present invention.

DESCRIPTION OF THE PREFFERRED EMBODIMENT

The principle of operation of the present invention shall be described with reference to the drawings and particularly describing a preferred embodiment available from Cincinnati Milcron Inc., the assignee of the present invention. The description of the preferred embodiment is not to be construed as a limitation of the scope of the invention, which is defined by the appended claims and all equivalents thereto.

Referring to FIG. 1(*a*) a transducer 10 is connected to a differential amplifier 12 by conductors 16 and 18. The conductors 16 and 18 are connected to opposite electrical poles of the transducer 10 which acts as a signal generator providing an output signal representing the magnitude of a physical phenomenon. While the present invention is advantageously used in conjunction with thermocouples for producing output signals representing temperature, the invention may be equally well applied to other transducers producing output signals representing for example, quantities of force, acceleration, pressure, fluid flow rates, or radiation. The amplifier 12 is a differential amplifier providing an output signal proportional to the difference of the input signals appearing at its differential inputs 2 and 4. As is well known, this type of amplifier provides a null output in the presence of "common mode" signals appearing at its differential inputs, i.e., signals of equal value. The effect is to eliminate electrical noise introduced equally into the circuits connected to the differential inputs. Although shown as continuous conductors, the conductors 16 and 18 may include multiple connections between the differential inputs 2 and 4 of the differential amplifier 12 and the transducer 10.

In normal operation, the output of the transducer 10 is a signal of low enough magnitude such that the output of the differential amplifier 12 is less than the limit value corresponding to saturation of the amplifier. A source 14 of a small bias current is connected to one input of the differential amplifier 12 proximate the differential amplifier. The other input of the differential amplifier is grounded proximate the amplifier. So long as the transducer 10 remains connected to the input of the differential amplifier 12, the bias current is shunted to ground and voltages in the conductors and the transducer attributable to the bias current are of negligible effect. In the event of loss of connection between the transducer 10 and the amplifier 12, the bias current from current source 14 creates an imbalance on the inputs 2 and 4 of differential amplifier 12 causing the amplifier to saturate. The bias current source 14 may be selected to effect saturation of the amplifier to either its positive or negative limits.

FIGS. 1(b) and 1(c) illustrate transducer interface circuits in accordance with the invention used with transducers which are grounded, as is preferable in certain environments. Referring to FIG. 1(b), the transducer 20 is connected to the differential amplifier 22 by conductors 24 and 26. While these conductors are shown continuous from the transducer 20 to the amplifier 22, there may be a plurality of connections between the transducer 20 and the amplifier 22 including connections dependent on the quality of mating connector components such as sockets and pins. The transducer 20 is connected to ground proximate its location and diodes 28 and 30 are connected to the input of amplifier 22 proximate the amplifier. The diode 28 is connected between conductor 24 and a positive bias voltage supply to be reverse biased when conductor 24 is connected to the positive electrical pole of transducer 20. Diode 30 is connected between the conductor 26 and a negative bias voltage supply to be reverse biased. So long as transducer 20 remains connected to amplifier 22 the reverse currents through the diodes 28 and 30 are conducted to ground and have no effect on the output of the amplifier 22. In the event of loss of connection between the transducer 20 and the amplifier 22, the reverse current of the diode connected to an open conductor between the amplifier 22 and the transducer 20 forces an imbalance on the inputs of the amplifier 22 causing the amplifier to saturate to its positive limit.

FIG. 1(c) shows the same circuit for connection of a transducer 20 to an amplifier 22 providing alternative connections of the diodes 28 and 30 to effect saturation of the amplifier to its negative limit in the event of loss of connection between the transducer 20 and the amplifier 22. As shown in FIG. 1(c) diode 28 is connected between conductor 24 and a negative bias voltage supply to be reverse biased and diode 30 is connected between conductor 26 and a positive bias voltage source to be reverse biased.

FIG. 2 is a detailed circuit diagram of a transducer interface in accordance with the preferred embodiment. In FIG. 2 the transducer 40 is connected to ground proximate the transducer. The positive pole of transducer 40 is connected by conductor 46 to a current limiting series resistance 54. The series resistance 54 is connected to one differential input 43 of a differential amplifier 42 contained within the dashed outline of FIG. 2. The grounded side of transducer 40 is connected by conductor 48 to a current limiting series resistance 58. The series resistance 58 is connected to the second differential input 44 of differential amplifier 42. The series resistances 54 and 58 are of relatively small magnitude and provide protection of the differential amplifiers against abnormally large voltages appearing across the transducer 40. A capacitor 50 is connected across the output of transducer 40 to provide filtering of unwanted signals appearing at the output of the transducer 40.

The differential amplifier is made up of operational amplifiers 60 and 62. A first differential input 43 is connected to a non-inverting input of operational amplifier 60 having feedback resistance 64. A second differential input 44 is connected to a non-inverting input of operational amplifier 62 having feedback resistance 66. The inverting inputs of the operational amplifiers 60 and 62 are connected together by resistance 68. The output of differential amplifier 42 is taken across the outputs designated E01 and E02. The difference of signals appearing at the outputs E01 and E02 is proportional to the output of the transducer, the ratio being defined by the values of the resistances 64, 66, and 68. In the circuit as shown where resistance 64 has a value RF1, resistance 66 has a value RF2 and resistance 68 has a value RC, this ratio is equal to $[1+(RF1+RF2)/RC]$.

Continuing with reference to FIG. 2, diode 52 is shown connected between the conductor 46 and a positive bias voltage source to be reverse biased and diode 56 is shown connected between conductor 48 and a negative bias voltage source to be reverse biased. As shown, the circuit of FIG. 2 will provide a positive saturation of the output signal between the output lines E01 and E02 in the event of loss of connection between the transducer 40 and either or both of the first and second differential inputs 43 and 44. Where used with thermocouples producing output signals of approximately 50 microvolts per degree Celsius, the inventor has chosen to provide a primary stage of amplification at the differential amplifier 42 by the construction shown in FIG. 2 using the operational amplifier LT1001CN8 available from Linear Technology Inc. In this circuit the diodes 52 and 56 selected by the inventor are IN4148 and series resistances 54 and 58 are 100 ohms. To achieve a gain of 21 through the differential amplifier 42, the resistances 64 and 66 are each 10,000 ohms and the resistance 68 is 1,000 ohms.

While the preferred embodiment has been described in considerable detail, it is to be noted that alternative circuit components may be suitably substituted. In particular, the applicant recognizes that a similar circuit may be used in conjunction with an alternative operational amplifier available from Linear Technology Inc., the LT1101. Other operational amplifiers may also be substituted. Further, while applicant has chosen to reverse bias standard diodes to obtain the desired bias currents, reverse biased transistor junctions could be used in place of the reverse biased diodes. Other arrangements for providing suitable bias currents may be recognized by those skilled in the art. It is the intention of applicant that the scope of the invention be construed to include all modifications, alterations, and equivalents falling within the spirit and scope of the appended claims.

What is claimed is:

1. A transducer interface circuit for detecting loss of connection of a transducer normally connected to the interface circuit, the interface circuit comprising:
   (a) a differential operational amplifier having first and second inputs normally connected to opposite electrical poles of the transducer, one input being grounded proximate the amplifier, the differential amplifier operating at less than saturation in response to the transducer output; and (b) current supply means connected to at least the ungrounded amplifier input proximate the amplifier, the current supply means providing current to cause saturation of the amplifier in the event of loss of connection of the amplifier to either or both of the transducer electrical poles.

2. The transducer interface circuit of claim 1 wherein the current supply means further comprises a bias voltage supply and a diode connected between the amplifier input and the bias voltage supply so as to be reverse biased irrespective of the magnitude of the transducer output.

3. A transducer interface circuit for detecting a loss of connection to a transducer normally connected to the interface circuit, the interface circuit comprising:

(a) a differential operational amplifier having first and second inputs normally connected to opposite electrical poles of the transducer, one of said poles being grounded proximate the transducer, the differential amplifier operating at less than saturation in response to the transducer output; and (b) current supply means connected to each input, the current supply means providing current to saturate the differential amplifier in the event of loss of connection of the transducer to either or both of the amplifier inputs.

4. The transducer interface circuit of claim 3 wherein the current supply means comprises:

(a) a first bias voltage supply;
(b) a second bias voltage supply;

(c) a first diode connected between one of the amplifier inputs and the first bias voltage supply proximate the amplifier, the first diode being connected so as to be reverse biased irrespective of the magnitude of the transducer output; and (d) a second diode connected between the other of the amplifier inputs and the second bias voltage supply proximate the amplifier, the second diode being connected so as to be reverse biased irrespective of the magnitude of the transducer output.

5. A transducer interface circuit comprising:

(a) a differential operational amplifier having first and second inputs normally connected to opposite electrical poles of a transducer, one electrical pole being grounded proximate the transducer, the differential amplifier operating at less than saturation in response to the transducer output;

(b) a first bias voltage supply;
(c) a second bias voltage supply;

(d) a first diode connected between the first bias voltage supply and the first input proximate the amplifier, the first diode being connected so as to be reverse biased irrespective of the magnitude of the transducer output; and (e) a second diode connected between the second bias voltage supply and the second input proximate the amplifier and being connected so as to be reverse biased irrespective of the magnitude of the transducer output, the first and second diodes and the first and second voltage supplies providing bias currents to cause saturation of the amplifier in the event of loss of connection between the transducer and one or both of the amplifier inputs.

* * * * *

REEXAMINATION CERTIFICATE (1951st)

United States Patent [19]

Topmiller

[11] B1 5,029,278

[45] Certificate Issued  Mar. 16, 1993

[54] TRANSDUCER INTERFACE CIRCUIT

[75] Inventor: David A. Topmiller, Ft. Wright, Ky.

[73] Assignee: Cincinnati Milacron Inc., Cincinnati, Ohio

Reexamination Request:
No. 90/002,592, Feb. 11, 1992

Reexamination Certificate for:
Patent No.: 5,029,278
Issued: Jul. 2, 1991
Appl. No.: 459,879
Filed: Jan. 2, 1990

[51] Int. Cl.⁵ ............... H03K 17/14; H03K 17/16; H03K 17/06; H03K 5/08
[52] U.S. Cl. .................. 307/565; 307/559; 307/552; 307/561; 340/652; 324/537
[58] Field of Search ............. 307/296.4, 494, 442, 307/559, 565, 515, 350, 362; 324/537, 500; 340/595, 652, 653

[56] References Cited

U.S. PATENT DOCUMENTS

| | | | |
|---|---|---|---|
| 3,760,265 | 9/1973 | Hutch | 324/51 |
| 4,166,243 | 8/1979 | West et al. | 324/51 |

FOREIGN PATENT DOCUMENTS

| | | | |
|---|---|---|---|
| 58-2919 | 1/1983 | Japan | 340/652 |
| 60-4868 | 1/1985 | Japan | 340/652 |

*Primary Examiner*—Timothy P. Callahan
*Attorney, Agent, or Firm*—John W. Gregg

[57] ABSTRACT

A transducer interface circuit is provided having means for detecting loss of connection of a transducer to the interface circuit. The interface circuit is intended for use with a transducer providing an output between two electrical poles of opposite polarity. Differential inputs of a differential amplifier are connected to the transducer poles. A bias current source is provided proximate the amplifier at least at one input, and the other input is connected to ground. Loss of connection between the transducer and amplifier results in saturation of the amplifier output.

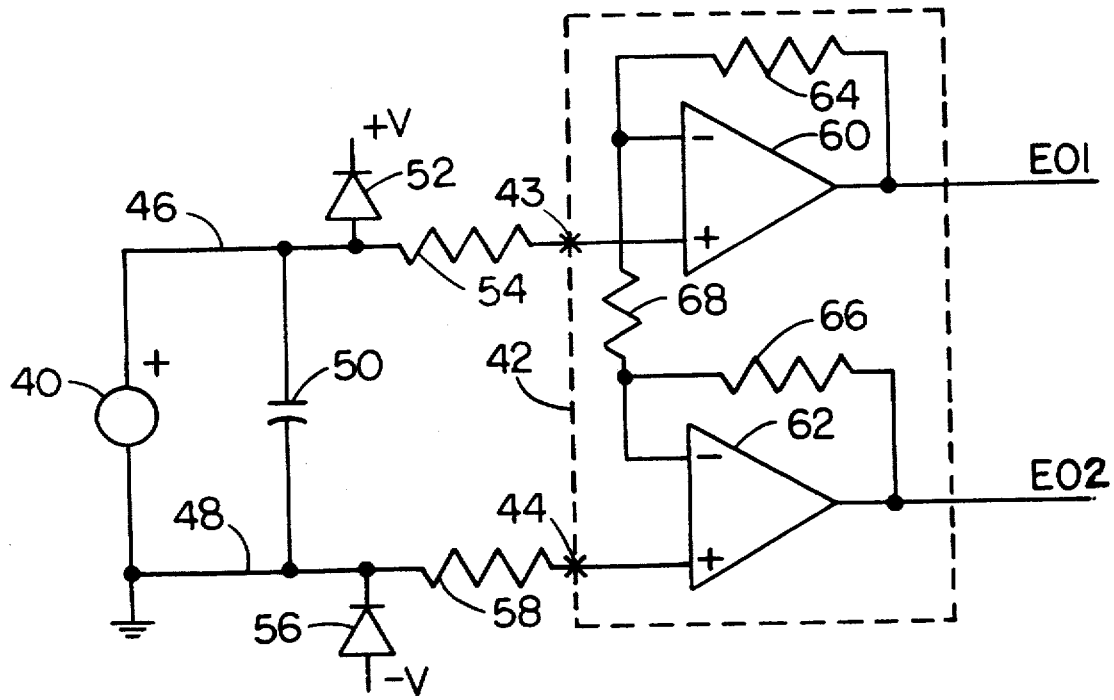

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3, 4, and 5 is confirmed.

Claims 1 and 2 are cancelled.

* * * * *